(12) United States Patent
Horch et al.

(10) Patent No.: US 6,815,734 B1
(45) Date of Patent: Nov. 9, 2004

(54) VARIED TRENCH DEPTH FOR THYRISTOR ISOLATION

(75) Inventors: Andrew Horch, Sunnyvale, CA (US); Scott Robins, San Jose, CA (US)

(73) Assignee: T-Ram, Inc., San Jose, CA (US)

( * ) Notice: Subject to any disclaimer, the term of this patent is extended or adjusted under 35 U.S.C. 154(b) by 0 days.

(21) Appl. No.: 10/262,758

(22) Filed: Oct. 1, 2002

(51) Int. Cl.[7] .............................................. H01L 29/74

(52) U.S. Cl. ...................................... 257/133; 257/124

(58) Field of Search ................................ 257/124, 125, 257/133, 137–153, 167, 903; 365/180; 438/133–140

(56) References Cited

U.S. PATENT DOCUMENTS

| | | | |
|---|---|---|---|
| 6,104,045 A | | 8/2000 | Forbes et al. |
| 6,156,620 A | * | 12/2000 | Puchner et al. ............. 438/400 |
| 6,225,165 B1 | | 5/2001 | Noble, Jr. et al. |
| 6,229,161 B1 | | 5/2001 | Nemati et al. |

OTHER PUBLICATIONS

Nemati, et al., *A novel high-density, low voltage SRAM cell with a vertical NDR device*, VLSI Technology, 1998, Digest of Technical Papers. 1998 Symposium on, Jun. 9–11, 1998, pp. 66–67.*

2001, K. DeMeyer, S. Kubicek and H. van Meer, *Raised Source/Drains with Disposable Spacers for Sub 100 nm CMOS technologies*, Extended Abstracts of International Workshop on Junction Technology 2001.

Mar. 1991, Mark Rodder and D. Yeakley, *Raised Source/Drain MOSFET with Dual Sidewall Spacers*, IEEE Electron Device Letters, vol. 12, No. 3, Mar. 1991.

Sep. 2001, Yang–Kyu Choi, Daewon Ha, Tsu–Jae King and Chenming Hu, *Nanoscale Ultrathin Body PMOSFETs With Raised Selective Germanium Source/Drain*, IEEE Electron Device Letters, vol. 22, No. 9, Sep. 2001.

Oct. 1, 2001, N. Lindert, Y.–K. Choi, L. Chang, E. Anderson, W.–C. Lee, T.–J. King, J. Bokor, and C. Hu, *Quasi–Planar FinFETs with Selectively Grown Germanium Raised Source/Drain*, 2001 IEEE International SOI Conference, 10/01.

(List continued on next page.)

*Primary Examiner*—Long Pham
*Assistant Examiner*—Marcos D. Pizarro-Crespo

(57) ABSTRACT

A semiconductor device is formed having a thyristor and trench arranged to electrically insulate an emitter region of the thyristor from another circuit structure. In one example embodiment of the present invention, a trench having a bottom portion with two different trench depths is etched in the substrate. A thyristor is formed having a control port in a trench and having an emitter region adjacent to the trench and below an upper surface of the substrate. A deeper portion of the trench electrically insulates the emitter region from the other circuit structure. The control port is capacitively coupled to the thyristor and to the other circuit structure (e.g. in response to at least one edge of a voltage pulse applied thereto). In one implementation, the trench further includes an emitter-access connector extending from the emitter region to an upper surface of the substrate. These approaches are also useful in high-density circuit applications, such as memory applications, where the semiconductor device is formed in close proximity with other circuitry, such as with other thyristors. In addition, the isolation approach is useful for applications where a cathode-down thyristor is used, such as when it is desirable to form the thyristor control port near a bottom portion of the thyristor. Moreover, the approaches discussed herein are useful for electrically isolating various portions of the semiconductor device using a relatively limited number of etching steps.

14 Claims, 7 Drawing Sheets

OTHER PUBLICATIONS

1998, T. Ohguro, H. Naruse, H. Sugaya, S. Nakamura, E. Morifuji, H. Kimijima, T. Yoshitomi, T. Morimoto, H.S. Momose, Y. Katsumata, and H. Iwai, *High Performance RF Characteristics of Raised Gate/Source/Drain CMOS with Co Salicide*, 1998 Symposium on VLSI Technology Digest of Technical Papers.

Aug. 2001, Hsiang–Jen Huang, Kun–Ming Chen, Tiao–Yuan Huang, Tien–Sheng Chao, Guo–Wei Huang, Chao–Hsin Chien, and Chun–Yen Chang, *Improved Low Temperature Characteristics of P–Channel MOSFETs with $Si_{1-x}Ge_x$ Raised Source and*.

* cited by examiner

VARIED TRENCH DEPTH FOR THYRISTOR ISOLATION

RELATED PATENT DOCUMENT

This patent document is related to U.S. patent application Ser. No. 10/262,792 (TRAM.017PA), entitled "Thyristor Device With A High Aspect Ratio Trench," and to U.S. patent application Ser. No. 10/262,728 (TRAM.018PA), entitled "Shunt Connection to Emitter," both of which are filed concurrently herewith and fully incorporated herein by reference.

FIELD OF THE INVENTION

The present invention is directed to semiconductor devices and, more specifically, to semiconductor devices including thyristors and implementations thereof including memory, current-switching applications and others.

BACKGROUND

An important part in the design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price), with DRAM cell size being typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density and is typically between about 60 $F^2$ and 100 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

Thyristor-type NDR devices can be effective in overcoming many previously unresolved problems for thyristor-based applications as well as memory applications. An important consideration in the design of a capacitively-coupled thyristor device involves designing the body of the thyristor sufficiently thin, so that the capacitive coupling between the control port and the thyristor base region can substantially modulate the potential of the base region. Another important consideration in semiconductor device design, including those employing thin capacitively-coupled thyristor-type devices, includes forming devices in highly dense applications. For instance, it may be advantageous to form a vertical thyristor having a cathode emitter region buried in a semiconductor substrate below one or more other thyristor regions. However, it is sometimes difficult to implement such a vertically-arranged thyristor in highly dense implementations due to difficulties associated with isolating the buried emitter region and other regions from other adjacent circuitry (e.g., from other emitter regions) in the substrate.

These and other design considerations have presented challenges to implement such a thin capacitively-coupled thyristor in a variety of circuit implementations, and in particular to highly dense applications.

SUMMARY

The present invention is directed to overcoming the above-mentioned challenges and others related to the types of devices and applications discussed above and in other applications, including memory cells and other switching circuits. The present invention is exemplified in a number of implementations and applications, some of which are summarized below.

According to an example embodiment of the present invention, a semiconductor device is manufactured having a trench with a shallower portion and a deeper portion in a substrate, the deeper portion being arranged to electrically insulate a buried emitter region of a thyristor. The thyristor includes a body and a control port, the body having an emitter region at a bottom portion of the thyristor and buried in the substrate. The control port is arranged to capacitively couple to the body for controlling current flow in the thyristor. Using a varied trench depth to electrically insulate a buried emitter in this manner is particularly useful, for example, in memory and/or other applications employing cathode-down thyristors and in high-density applications where it is desirable to electrically insulate buried emitter regions and/or other circuit regions from nearby circuitry.

In one implementation, the semiconductor device further includes a pass device electrically coupled to the buried emitter region of the thyristor. Source/drain regions of the pass device are formed separated by a channel region in the substrate, and a gate is formed over the channel region and adapted for capacitively coupling thereto for controlling current in the pass device. The pass device is adapted for controlling access between the buried emitter region and a data output node, such as a bit line.

In another example embodiment of the present invention, the first, relatively deeper portion of the trench is further adapted for inhibiting diffusion in the substrate. For instance, when emitter regions of thyristors are formed, dopants used to form the emitter regions can out diffuse or otherwise reach other portions of the substrate, which can be undesirable. With this approach, such undesirable diffusion can be inhibited or even eliminated.

In a more particular example embodiment of the present invention, one or more of the semiconductor devices discussed above are formed in a memory array and adapted for read and write access. A buried emitter region of each thyristor is adapted for storing data (e.g., a "one" or a "zero") as a function of its state (e.g., controlled by the latched state of the thyristor). The memory cell is arranged such that the storage and retrieval of the data can be controlled via signals applied to the thyristor control port and the gate of the pass device, as well as to emitter regions of the thyristor. Electrical insulation of the buried emitter regions is achieved using the varied-depth trench, facilitating the formation of highly dense arrays of thyristor-based memory cells.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which:

FIGS. 1A–4 show a thyristor-based semiconductor device at various stages of manufacture, according to an example embodiment of the present invention, wherein FIG. 1A shows a shallow trench isolation region being etched for a thyristor-based semiconductor device, FIG. 2 is the semiconductor device of FIG. 1A having a deep trench etched therein, FIG. 3 is the semiconductor device of FIG. 2 having a thyristor control port formed in the trench and an emitter region implanted in the device, and FIG. 4 is the semiconductor device of FIG. 3 having thyristor body regions implanted adjacent to the thyristor control port;

Figure 1A:
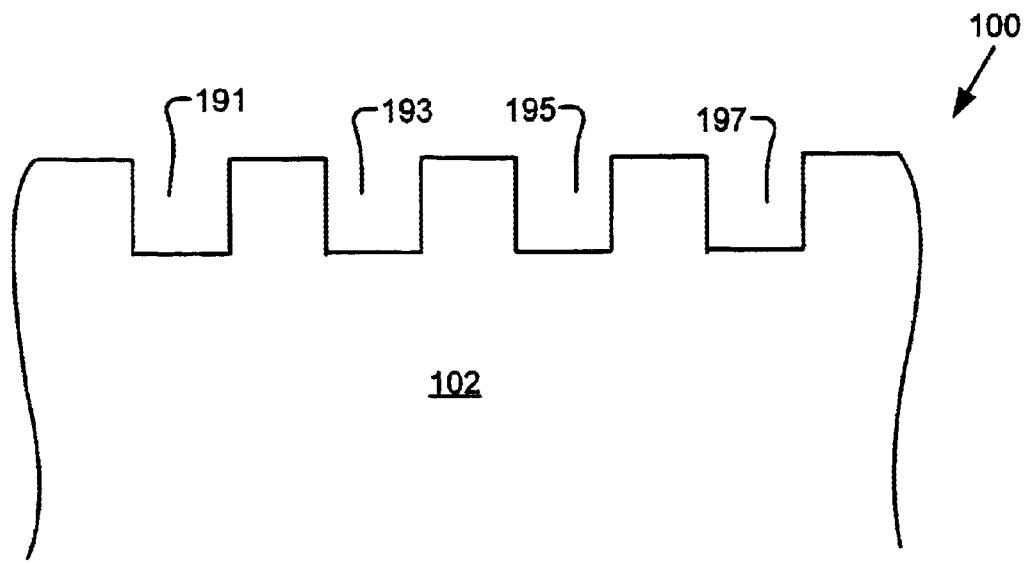

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor applications, and has been found to be particularly useful for thyristor-based semiconductor devices including emitter regions buried in a substrate. While the present invention is not necessarily limited to such applications, various aspects of the invention may be appreciated through a discussion of various examples using this context.

According to an example embodiment of the present invention, a semiconductor device is formed in a substrate and having a thyristor and a deep trench isolation region. The deep trench isolation region is formed having a varied depth, with a deeper portion of the trench extending deeper into the substrate than a shallower portion of the trench. The deeper portion electrically insulates a buried emitter region of the thyristor from other circuitry, such as transistors, NDR devices, interconnects or other thyristors in the substrate.

In one implementation, forming the deep trench isolation region includes first etching a shallow trench in the substrate and filled with an insulative material to form shallow trench isolation (STI). A portion of the insulative material in the STI is then etched, followed by a deep trench etch that etches a contiguous portion of the substrate that includes a portion of the etched STI and a portion of the substrate laterally adjacent to the STI. The portion of the deep trench etched through the etched STI region is thus formed extending deeper than the rest of the deep trench, and electrically insulates a buried emitter of the thyristor from other circuitry in the semiconductor device, as shown in various ones of the figures that follow. With this overlap of STI and deep trench regions, the isolation process is simplified by using two trench etch processes (the STI process and the deep trench process) to form trench portions at three different depths, including the STI region and the two deep trench portions.

The thyristor includes a body region adjacent to the deep trench and a control port in the shallower portion of the deep trench. The body region includes a base region and the buried emitter region, and the control port is adapted for capacitively coupling at least one edge of a voltage pulse to the base region for controlling current therein. The deeper portion of the deep trench extends about as deep as the buried emitter region and separates the buried emitter region from other circuitry in the device for a variety of implementations. In one implementation, the deeper portion isolates buried emitter regions of adjacent thyristors. In another implementation, the deeper portion of the trench is inhibits and/or prevents lateral diffusion of materials, such as dopants, from the emitter region. These approaches are particularly useful when forming circuitry in close proximity to the thyristor body region in the substrate.

In another implementation, the semiconductor device further includes a pass device that is adjacent to the thyristor and including source/drain regions in the substrate. A portion of the control port is etched out of the deep trench between the buried emitter region and a source/drain region of the pass device, and an insulative material layer (e.g., an insulative liner) is formed on sidewalls and a bottom therein. The insulative material at the bottom is removed (e.g., etched) and an emitter-access connector that electrically couples the buried emitter region with the source/drain region is formed on the insulative material and in the etched portion of the deep trench.

The buried emitter region is formed in a variety of manners, depending upon the application. In one implementation, a dopant is implanted via a bottom portion of the portion of the deep trench in which the emitter-access connector is to be formed, prior to forming the connector. In another implementation, material in the connector is out-diffused into substrate adjacent to the connector, doping the substrate and forming the emitter region. In either implementation, the dopant is selected for the particular application to which the device is to be applied. For instance, N+ dopant can be implanted or out-diffused into the emitter region to form a cathode emitter in a cathode-down thyristor device formed using a high aspect ratio trench. For general information regarding thyristor implementations, and for specific information regarding high aspect ratio trench applications to which the present invention is applicable, reference may be made to the U.S. patent document Ser. No. 10/262,792 discussed above entitled "Thyristor Device With A High Aspect Ratio Trench" (TRAM.017PA). Similarly, for general information regarding thyristor implementations, and for specific information regarding the use of an emitter-access connector to a buried emitter, reference may also be made to the U.S. patent document Ser. No. 10/262,728 discussed above entitled "Shunt Connection to Emitter" (TRAM.018PA).

In other implementations, the etch processes used in the above-discussed example embodiments and implementations thereof are altered. In one instance, three trench etch steps are used, including one etch step for the STI, one etch step for insulating adjacent thyristors and a deeper trench etch step to insulate buried emitter regions of the adjacent thyristors. In another instance (e.g., where STI is not necessarily required for isolation), the STI step is eliminated, with two etch steps being implemented and including a first deep trench etch step to insulate adjacent thyristors and a second deeper trench etch step to insulate emitter regions of adjacent thyristors.

FIGS. 1A through 4 show a thyristor-based (i.e., thyristor-including) semiconductor device 100 at various stages of manufacture and having a deep trench with varied trench depth and adapted to electrically insulate a buried thyristor emitter region, according to a particular example embodiment of the present invention. FIG. 1A is a cross-section 102 from a top view perspective of the device 100 as shown in FIG. 1B. A semiconductor substrate 102 is masked, shallow trench isolation (STI) regions 101, 103, 105 and 107 are etched and insulative material is formed in the etched regions. After the STI regions are formed, the device 100 is masked and portions 191, 193, 195 and 197 of the insulative material are etched, forming a stepped upper surface of the substrate 102, as shown in FIG. 1A.

Figure 2:
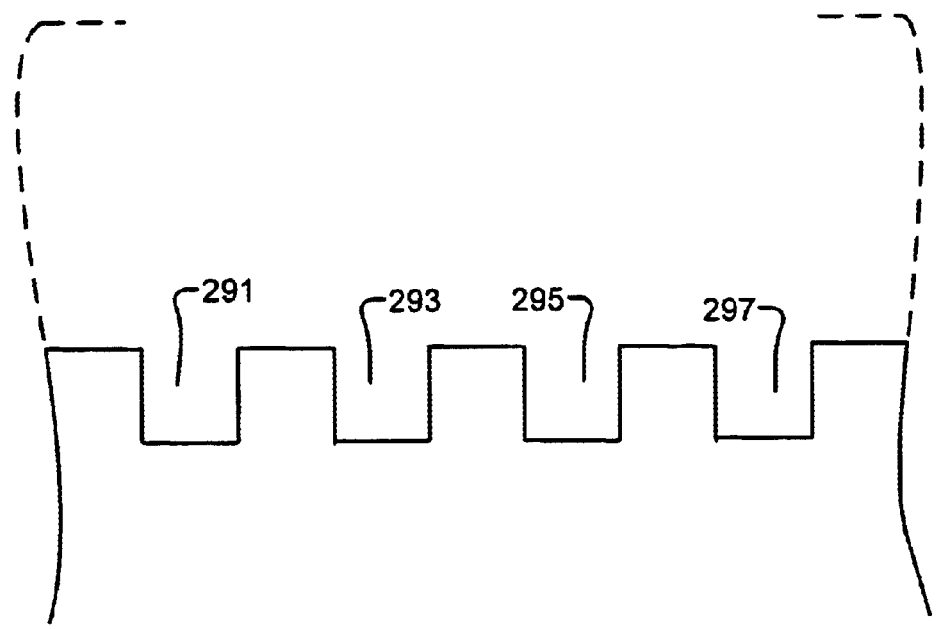
Figure 1B:
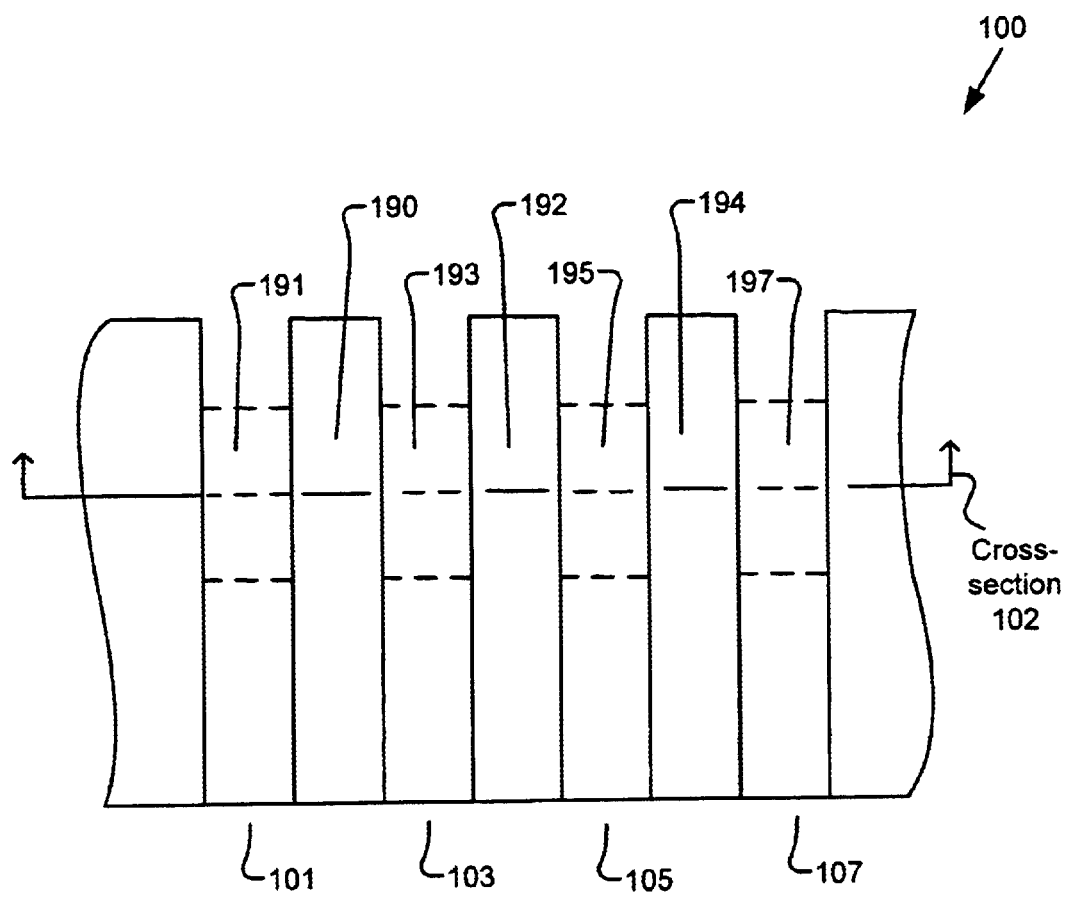
FIG. 1B is a top view of FIG. 1A.

FIG. 2 shows a deep trench being etched in the semiconductor device of FIG. 1, with dashed lines showing where the substrate has been etched away. The stepped structure shown in FIG. 2 is similar to the stepped structure at the surface shown in FIG. 1A, for example, as would be achieved using an etch rate that is generally similar across the device in a timed etch application. The resulting structure facilitates the electrical isolation of regions with the deeper portions 291, 293, 295 and 297 of the deep trench.

Figure 3:
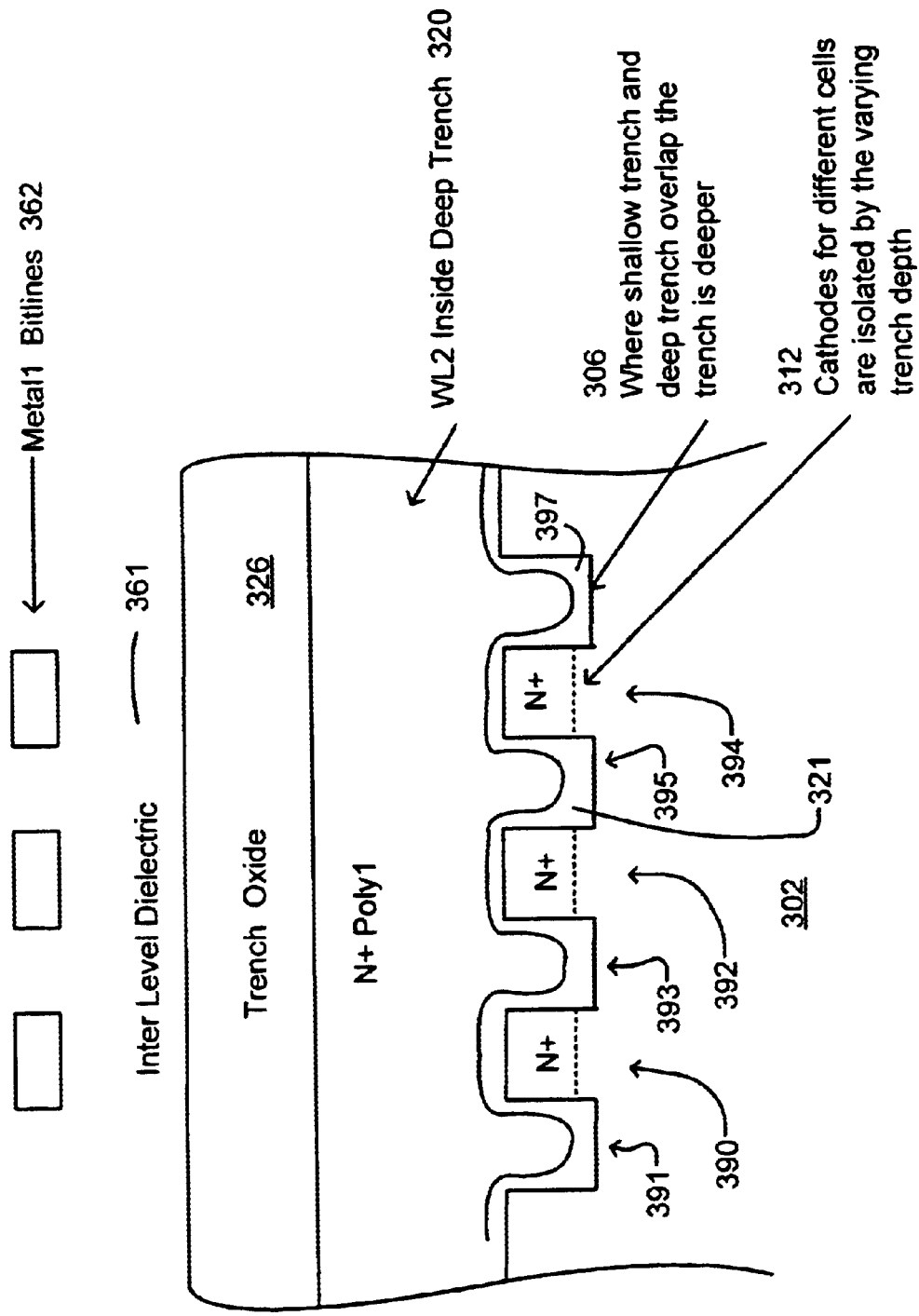

FIG. 3 shows a cross-sectional view of a more detailed implementation of a deep trench isolation approach, according to one particular implementation, with isolation regions 391, 393, 395 and 397 corresponding to isolation regions 291, 293, 295 and 297 in FIG. 2. The cross-sectional view shown in FIG. 3 may, for instance, be implemented in connection with cross-section 504 shown in FIG. 5 and discussed further below. In this implementation, a control port 320 is formed in a deep trench lined with an insulative material (e.g., a dielectric) 321 for three thyristor-based memory cells 390, 392 and 394. Each cell includes an N+ cathode emitter region, such as region 312, that is implanted in a substrate 302 and electrically insulated by a trench having a varied depth. The insulative liner material 321 electrically insulates the control port 320 from the N+ cathode emitter regions. Each memory cell is adapted for storing information at the N+ cathode emitter regions for read and write memory access.

As similarly shown in FIGS. 1A–2, a shallow trench for STI is first formed and etched where the deep trench is to be formed, followed by a deep trench that results in regions 391, 393, 395 and 397 being deeper where the STI was formed. N+ cathode regions 390, 392 and 394 are formed (e.g., implanted through the bottom of an adjacent trench) and the deeper regions are adapted to electrically insulate adjacent N+ cathode regions. Each cathode emitter region is electrically coupled to a source/drain region of an adjacent pass device with an emitter-access connector (e.g., shunt connector), for example, as described in the U.S. Patent Application entitled "Shunt Connection to Emitter" (TRAM.018PA), discussed above.

In one implementation, the control port 320 is formed by first depositing N+ poly1 material (e.g., formed during a first polysilicon deposition) near a bottom portion of the trench and forming dielectric material 326 (e.g., oxide) over the N+ poly1 material. Inter-level dielectric material 361 is formed over the thyristor regions and metal 1 bit lines (e.g., formed during a first metal deposition), including bit line 362, are formed over the dielectric material 326. The metal 1 bit lines are electrically coupled to a source/drain region of an adjacent pass device (see, e.g., FIG. 6) via a data output node, such as a via or interconnect. Remaining portions of each memory cell, including thyristor body and pass device portions, are also formed in a manner not inconsistent with the present invention, and may include one or more aspects as shown in the other figures as well as in the patent documents incorporated herein by reference.

In another implementation, the insulative material 321 discussed above has a varied thickness, with a thicker portion thereof adjacent to the N+ cathode regions and a relatively thinner portion thereof adjacent to the P base region 414. The varied thickness facilitates the capacitive coupling of a voltage pulse from the control port 320 to the P base region 414, while insulating the control port from the N+ cathode region 412. For instance, in high-aspect-ratio applications, it has been found to be advantageous to fill some of the lower portion of the trenches adjacent to the N+ cathode regions with conductive material, such as the material used to form the control port 320. In this regard, the thicker portion of the insulative material 321 inhibits the conductive material in the lower portion of the trenches from capacitively coupling to the N+ cathode emitter regions.

Various ones of the example embodiments described below in connection with the figures share similar features with each other and with the figures discussed above. In each of these example embodiments, certain discussion of similar features that are similarly numbered is omitted for brevity.

Figure 4:
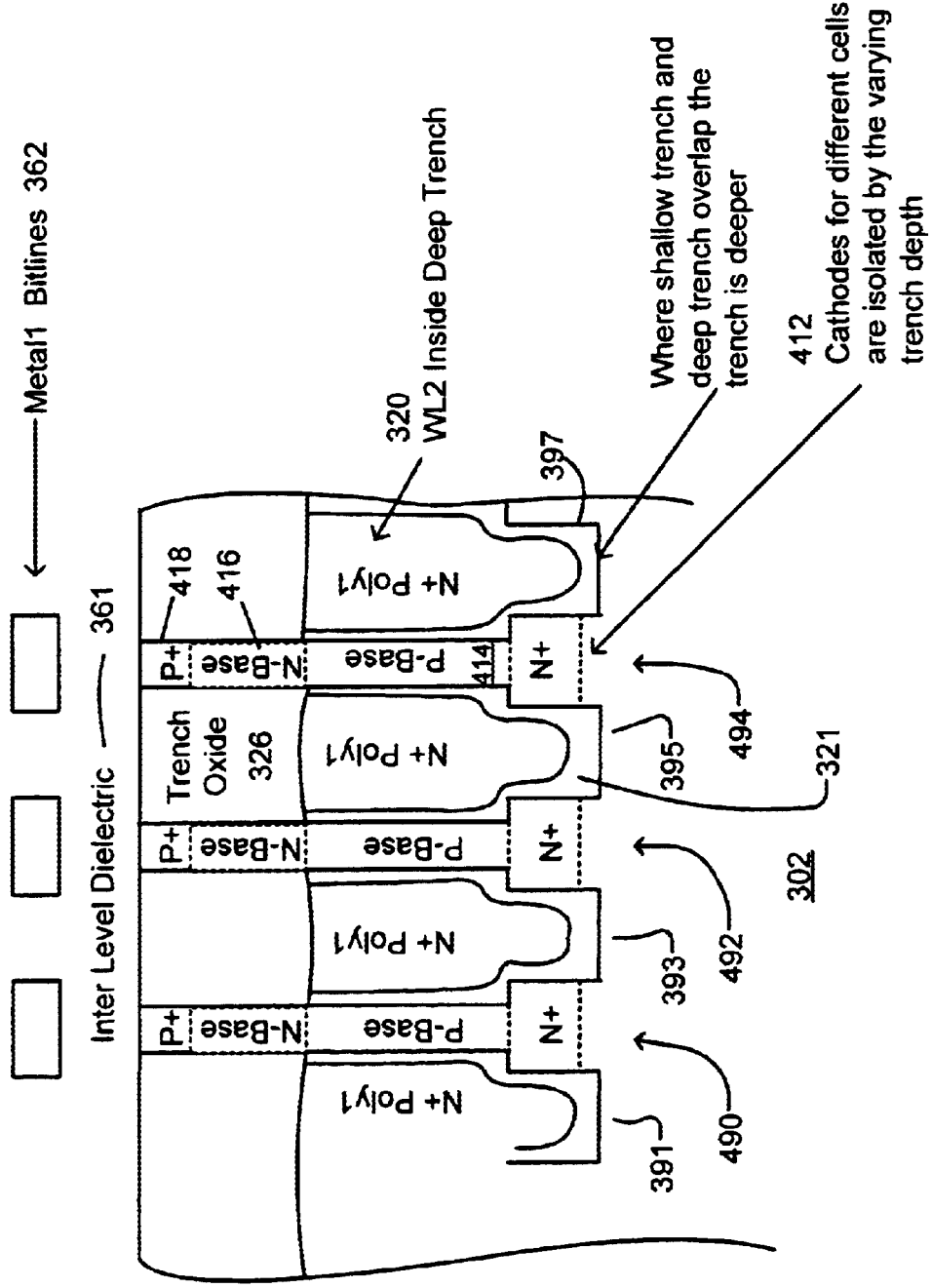

FIG. 4 shows another cross-sectional view of an adjacent portion of the thyristor-based semiconductor device shown in FIG. 3, where thyristor body regions 490, 492 and 494 are formed having a P base region 414 capacitively coupled to the control port 320 formed near a bottom of a deep trench. The cross-sectional view shown in FIG. 4 may, for instance, be implemented in connection with cross-section 505 shown in FIG. 5 and discussed further below. N+ cathode emitters of each thyristor are electrically insulated by the trench regions 391, 393, 395, and 397 and are electrically coupled to a source/drain region of a pass device (e.g., using an emitter-access connector). In one implementation, the control port is arranged for capacitively coupling at least one voltage transition to the P base region 414 for causing an outflow of minority carriers therefrom and controlling current flow therein. In another implementation, the outflow of minority carriers is independent from any MOS-inversion channel formation.

The thyristors including body regions 490, 492 and 494 can be formed in a variety of manners. Using thyristor body region 494 as an example, the N+ cathode emitter region 312 is implanted in the substrate via an adjacent trench, and P base region 414, N base region 416 and P+ anode emitter region 418 are implanted in polysilicon. Inter-level dielectric material 361 and metal 1 bit lines 362 are formed over the body regions, and the bit lines are electrically coupled to a source/drain region of an adjacent pass device in series with the P+ emitter regions. As with FIG. 3, remaining portions of the memory cell are formed in a manner not inconsistent with the present invention, and may include one or more aspects as shown in the other figures.

Figure 5:
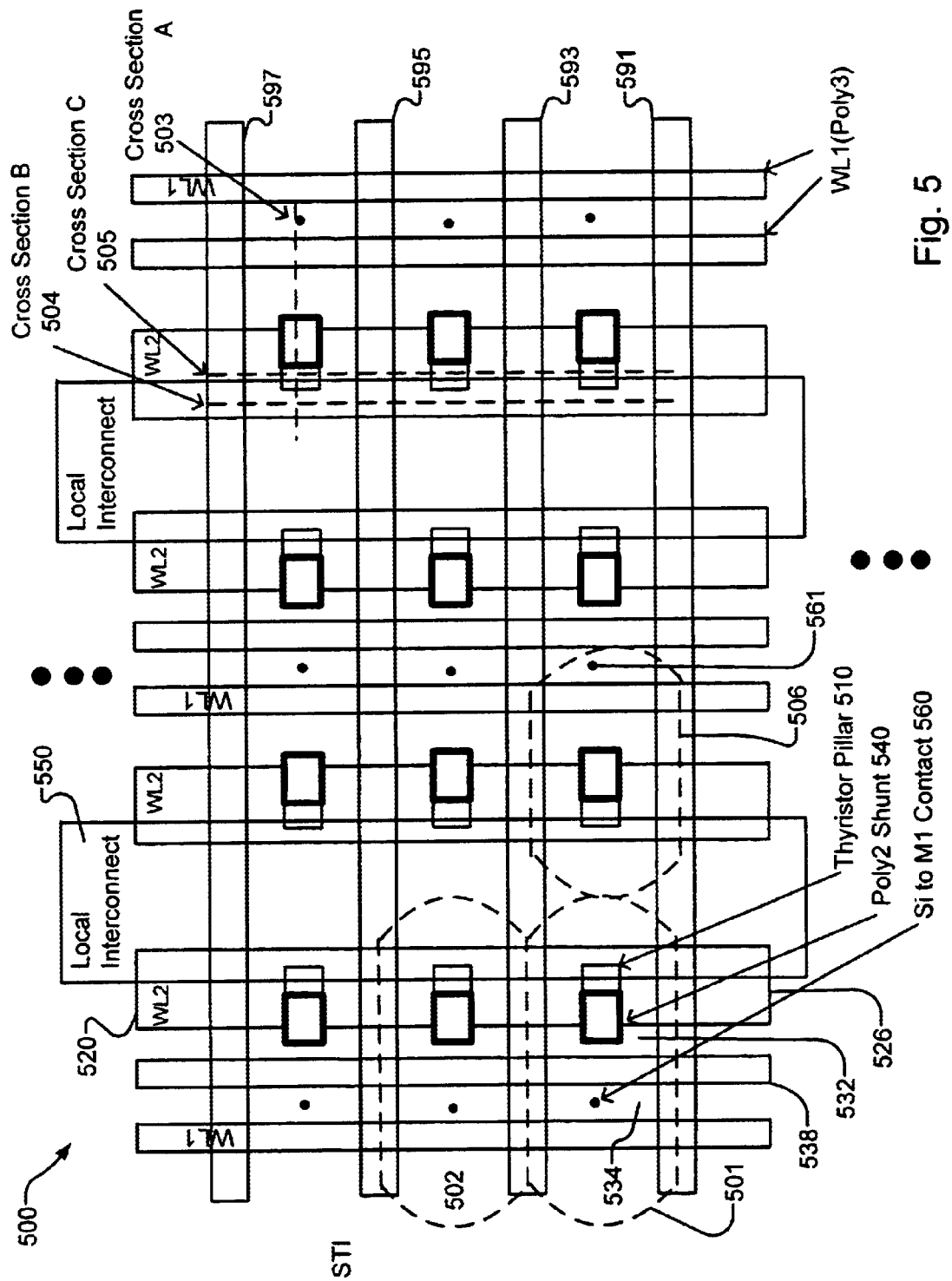
FIG. 5 is a cross-section of a memory array having a varied trench depth, according to another example embodiment of the present invention.

FIG. 5 shows a memory array 500 having thyristor-based devices formed having a varied trench depth for electrically isolating memory cells, according to another example embodiment of the present invention. The memory array 500 may, for example, be formed using one or more of the methods described in connection with FIGS. 1A–4. The memory array 500 includes plurality of memory cells arranged in data-accessible groups, with each group including data storage circuits and with each of the data storage circuits having respective data output nodes connected to a common bit line. For instance, cells 501 and 502 share word lines 520 and 538. Cells 501 and 506 are coupled to a single bit line (not shown) via bit line contacts 560 and 561 as well as interconnect 550. One or more of the memory cells is formed having a control port near a bottom portion of a trench, for example, as discussed above, and a relatively deep portion of a trench insulating a buried thyristor emitter region. Shallow trench isolation (STI) regions 591, 593, 595 and 597 are formed in a substrate and adapted to electrically insulate portions of adjacent memory cells, with STI region 593 electrically isolating portions of cells 501 and 502 from each other. In one particular implementation, the STI is used to form a deep trench for isolating buried emitter regions of the thyristor-based devices.

Referring to memory cell 501 as an example, a deep trench 526 is formed in a substrate and a control port 520 (e.g., such as control port 320 in FIGS. 3 and 4) is formed in the deep trench. A thyristor emitter region (e.g., such as region 312 in FIGS. 3 and 4) is implanted via a bottom portion of the trench and below a thyristor pillar 510. A cathode shunt 540 (e.g., an emitter access connector) is also formed in the deep trench and electrically coupled to the cathode emitter region. The cathode shunt 540 is particularly useful, for example, for bringing an electrical connection from the cathode emitter region to a region near a surface of the device for accessing the cathode emitter region.

After the cathode shunt 540 is formed, thyristor body regions are implanted in pillar 510, with the control port 520 being capacitively coupled to the body region and adapted to control current flow in the thyristor pillar. In one implementation, base regions of the thyristor body are implanted during a blanket implant in the substrate, prior to etching the deep trench. A pass device is coupled in series with the cathode via the cathode shunt 540 and includes source/drain regions 532 and 534 separated by a channel region below a first word line 538. A bit line contact 560 electrically couples the source/drain region 534 to a metal1 (M1) bit line, such as bit line 362 shown in FIGS. 3 and 4.

The memory array can be implemented using one or more of a variety of memory cells, including those discussed herein. For example, cross-section A (503) may be implemented using the device shown in FIG. 6 and discussed below, and cross-sections B (504) and C (505) may be implemented as shown in FIGS. 3 and 4, respectively. In addition, the array 200 may be extended as represented by the dotted lines in FIG. 5.

Figure 6:
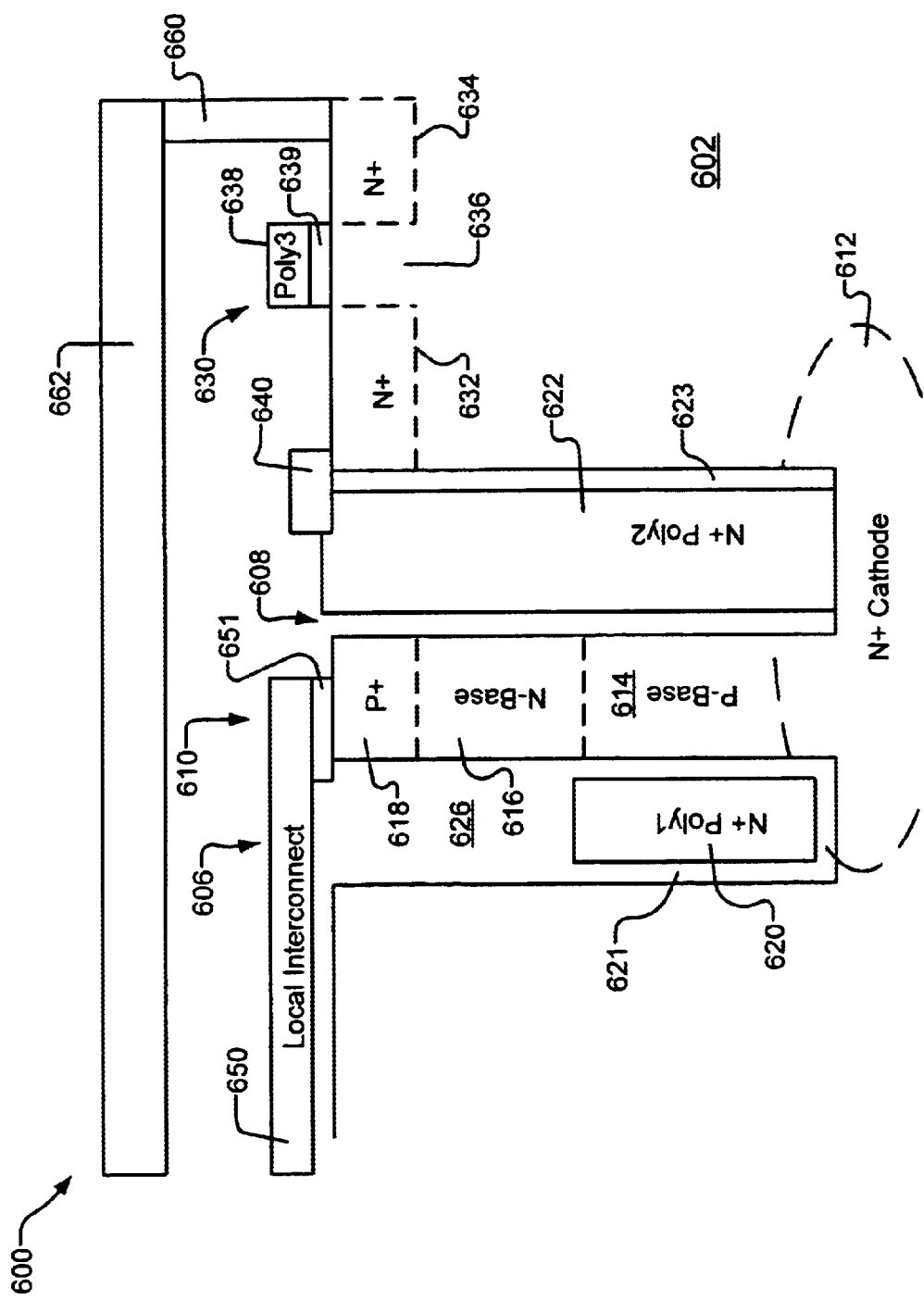
FIG. 6 is an example cross-section of the memory array of FIG. 5, according to another example embodiment of the present invention.

Referring now to FIG. 6, a thyristor-based memory cell 600 is formed using a varied-depth trench including trench portions 606 and 608 and formed in a manner not inconsistent with the various example embodiments described herein (e.g., as shown in FIG. 4). When viewed in connection with FIG. 5, a deeper portion of the trench including trench portions 606 and 608 is formed where STI regions 595 and 597 are and adjacent to the memory cell 600 as represented at cross section A (503). More specifically, trench portions 606 and 608 are etched in a substrate 602 and adjacent to a thyristor body region 610, with a portion of the trench below the STI 595 and 597 being deeper than other portions of the trench, as shown in FIG. 4. A portion of the substrate below the trench portion 608 is implanted to form a N+ cathode emitter region 612 of the thyristor (e.g., similar to region 312 in FIG. 4), and the buried emitter region is electrically insulated from other circuitry using the varied-depth trench.

A control port 620 is formed in the trench portion 606 after the trench regions are etched, and an emitter-access connector 622 is formed between the buried emitter region 612 and an adjacent pass device 630. First, trench portion 606 is lined with a dielectric material 621 at bottom and sidewall portions of the trench. Conductive material (e.g., polysilicon) is then formed in the lined trench and insulative material is formed in the trench and over the control port. The conductive material and the dielectric material are arranged such that the conductive material is capacitively coupled to the thyristor body region 610 via the dielectric material when a voltage is applied thereto. Trench portion 608 is etched for forming the emitter-access connector extending from the emitter region 612 to an upper portion of the substrate 602. If necessary, conductive material and/or dielectric material formed in the trench portion 608 during formation of the control port 620 is removed prior to forming the emitter-access connector. A portion of the trench portion 608 (e.g., on thyristor region 610 and on the conductive material deposited for the control port) is lined with an insulative spacer material 623, such as an oxide, forming a lined trench. The emitter-access connector 622 is then formed in the lined trench, with any portion of the conductive material extending over the substrate 602 being subsequently etched.

After the control port 620 and the emitter-access connector 622 are formed, thyristor body regions including P base region 614, N base region 616 and P+ anode emitter region 618 are implanted in the thyristor region 610. These regions may, for example, be implemented in a manner similar regions of the thyristor device in FIG. 4, with body regions 414, 416 and 418 corresponding to regions 614, 616 and 618 of FIG. 6. The P base region and the control port 620 are arranged such that the control port is capacitively coupled to the P base region 614 via the dielectric material 621 when a voltage pulse is applied thereto. The capacitively coupled voltage pulse is used for controlling current flow in the thyristor between the insulated N+ cathode emitter 612 and the P+ anode emitter 618.

After the thyristor body regions are formed, pass device 630 is formed electrically coupled in series with the P+ anode emitter region 618. First, a dielectric material 639 and a gate electrode material 638 (e.g., polysilicon) are deposited, patterned and etched over the substrate 602. The N+ source/drain regions 632 and 634 are then implanted in the substrate 602, separated by a channel region 636, using the gate electrode for alignment. The gate electrode is adapted to control current flow between the source/drain regions 632 and 634 in response to a voltage being applied thereto. A contact region 651 is formed on the P+ anode emitter region 618, and interconnect 650 is electrically coupled to the contact region 651 and to other circuitry (not shown), such as a reference voltage line. Another contact 640 is formed bridging over the insulative material 623 and electrically coupling the emitter-access connector 622 with the N+ source/drain region 632, which couples the pass device 630 in series with the N+ cathode 612. A bit line contact 660 couples the N+ source/drain region 634 to a bit line 662, and thereby electrically couples the N+ cathode region 612 to the bit line 662 when the pass device 630 is in a current passing mode. In response to signals applied to the gate 638 and the control port 620, as well as to signals applied to the bit line 662 and the local interconnect 650, the thyristor-based device 600 is adapted for writing data to and reading data from the N+ cathode emitter region 612.

Figure 7:
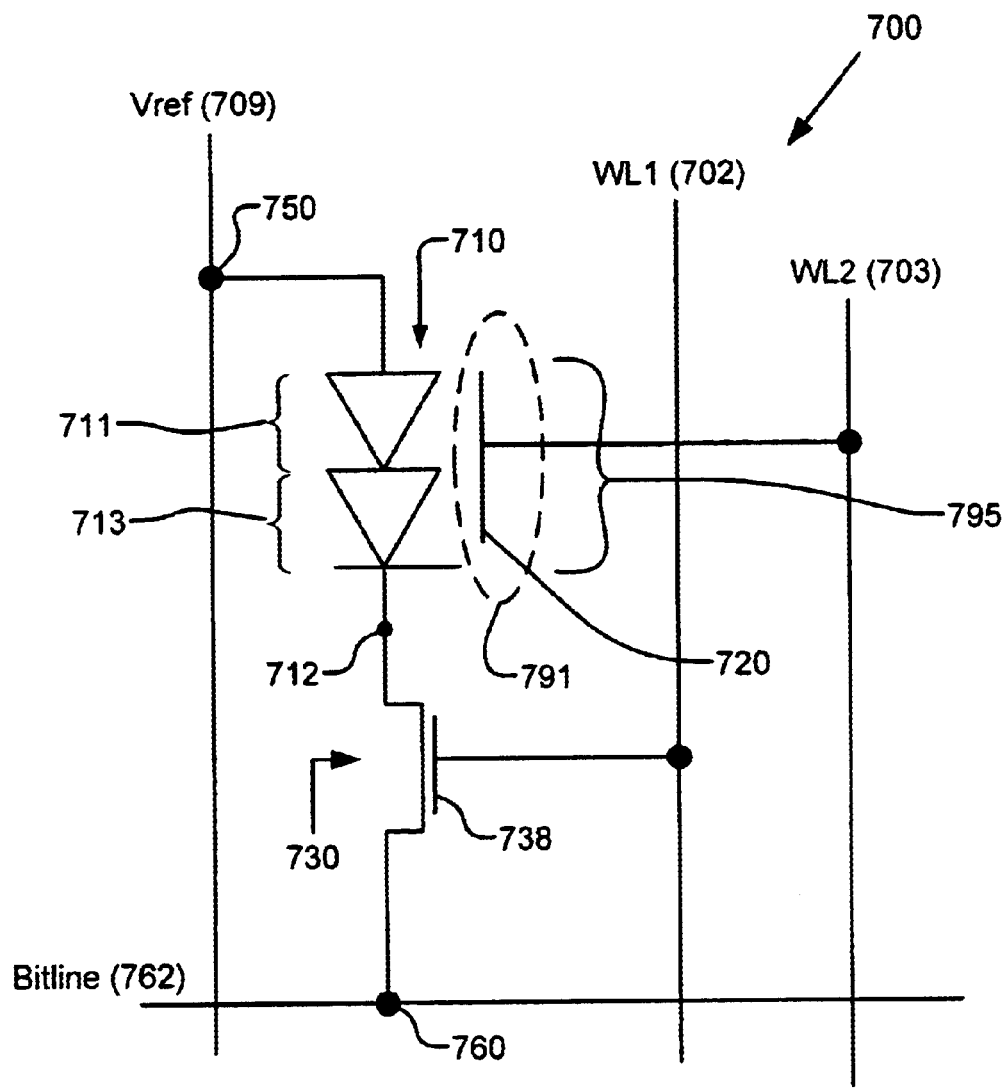
FIG. 7 is a circuit arrangement 700 including a thyristor device with varied trench in a substrate, according to another example embodiment of the present invention.

FIG. 7 is a circuit arrangement 700 including a thyristor 795 and a pass device 730 (e.g., a transistor) electrically coupled in series and adapted for storing data at a storage node 712, according to another example embodiment of the present invention. The circuit arrangement 700 may include, for example, one or more of the arrangements discussed hereinabove, including those discussed in connection with the figures. The thyristor 795 includes a body 710 and a control port 720, the body having first and second end regions 711 and 713, respectively, each end region having a base region and an emitter region. The second end region 713 is in a substrate having a varied-depth trench 791 therein and adjacent to the thyristor body 710. The varied-depth trench 791 includes the control port 720 and also electrically insulates the emitter region of the second thyristor end region 713 from other circuitry (not shown).

Control ports 720 and 738 are adapted for controlling current flow in the thyristor body 710 and the pass device 730, respectively, in response to signals applied to first (WL1) and second (WL2) word lines 702 and 703. In one implementation, the control port 720 is adapted to capacitively couple at least one voltage transition to the base region of the second thyristor end region 713 for causing an outflow of minority carriers therefrom and controlling current flow in the thyristor 795. A contact 750 is adapted to electrically couple a signal from a reference voltage (Vref) line 109 to the emitter region of the first thyristor end region 711. In addition, data output node 760 is adapted to electrically couple a signal between a bit line 762 and a source/drain region of the pass device 730, for example, for reading data out from the data storage node 712. For more information regarding data storage and manipulation with a thyristor-based device, such as the device 100, and in particular for controlling current in a thyristor-based device with a capacitively coupled control port, reference may be made to U.S. Pat. No. 6,229,161, which is fully incorporated herein by reference.

As an alternative approach, any of the above embodiments can be modified using the approach(es) illustrated and described in concurrently-filed U.S. Provisional Patent Application Serial No. 60/415,356 (TRAM.037P1), entitled "Novel Minority Carrier Isolation Device.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors and connectors; adding structures to the integrated circuit device; increasing the number of PN sections in the thyristor; and interchanging P and N regions in the device structures and/or using PMOSFETS rather than NMOSFETS. In addition, for more information regarding implementations to which the present invention is applicable and detailed construction of example thin-capacitively-coupled thyristor and components thereof, reference may be made to U.S. Pat. No. 6,229,161, which is fully incorporated herein by reference. Such modifications and changes do not depart from the true spirit and scope of the present invention that is set forth in the following claims.

What is claimed is:

1. A semiconductor device comprising:

a semiconductor substrate;

a thyristor having a body with an emitter region and an adjacent base region and having a control port, the emitter region being in the substrate and below the base region, the control port being adapted for capacitively coupling at least one edge of a voltage pulse to the base region;

a shallower trench portion in the substrate and including at least a portion of the control port;

a deeper trench portion having an upper region laterally adjacent to the shallower trench portion and having a lower region being arranged deeper into the substrate than the shallower trench portion and being arranged laterally to the emitter region;

a pass device having first and second source/drain regions seperated by a channel region and a gate capacity coupled to the channel region, the pass device being electrically coupled to the emitter region;

a shallow trench isolation (STI) region in the substrate and adapted to electrically insulate the pass device from adjacent circuitry; and a circuit structure in the semiconductor substrate and susceptible to reacting electrically in response to said at least one edge of a voltage pulse, wherein the STI region extends laterally in a first direction and wherein the circuit structure is located, relative to the emitter region, in a direction that is about parallel to the first direction.

2. A semiconductor device comprising:

a reference voltage line;

a substrate having an upper surface;

a plurality of memory cells arranged in an array in data-accessible groups, each group including data storage circuits with each of said data circuits having respective data output nodes connected to a common bit line;

each of the memory cells including:

a thyristor having a body and a control port, the body having first and second end portions, the first end portion including an emitter region and a base region in the substrate and below the upper surface, the second end portion including a base region and an emitter region and the control port being adapted for capacitively coupling a pulse to the base region of the first end portion;

the emitter region of the second end portion being coupled to the reference volatage line;

the base regions of the first and second end portions being coupled to one another;

an emitter-access connector extending from a node at the upper surface to a node at he emitter region of the first end; and a transistor having first and source/drain regions and a gate, the source/drain regions being adjacent to the upper surface of the substrate and separated by a channel region in the substrate, the gate being over the channel region adapted for controlling current flow between the source/drain regions, the first source/drain region further being electrically coupled to the emitter region of the first end portion via the emitter-access connector at the node at the upper surface;

a shallow trench isolation (STI) region in the substrate and separating adjacent transistors located in adjacent rows of the data-accessible groups; and a lined trench region in the substrate and including a shallower trench region and a deeper trench region;

the shallower trench region including at least a portion of the control port for a column of adjacent thyristors located in adjacent rows of the data-accessible groups, the emitter-access connectors for each adjacent thyristors and insulative liner material that separates and electrically insulates the control port from the emitter-access connectors; and the deeper trench region being disposed below the STI region and between emitter regions of adjacent thyristors to which control port is adapted for capacitively coupling said pulse to, the deeper trench region further electrically insulating said emitter regions of adjacent thyristors to which the control port is adapted for capacitively coupling said pulse to.

3. A semiconductor device comprising:

a semiconductor substrate;

NDR means for switching current, the NDR means having a body and a control port, the body including a base region and an emitter region, the base region being over the emitter region, the emitter region being the semiconductor substrate, the control port being adapted for capacitively coupling at least one edge of a voltage pulse to the base region;

circuit means arranged in the semiconductor substrate for reacting electrically in response to said at least one edge pulse;

a shallower trench portion including at least a portion of the control port; and means, extending deeper into the substrate than the shallower trench portion and laterally between the emitter region and the circuit structure, for electrically insulating the emitter region from the circuit stricture.

4. A semiconductor device comprising:

a semiconductor substrate having an upper surface;

first and second adjacent thyristors, each thyristors including:

a body and a control port, the body including first and second end portions, each end portion having a base region and an emitter region, the first end portion being in the substrate and below the upper surface, the control port being adapted for capacitively coupling at least one edge of a voltage pulse to the base region of the first end portion of each of the first and second adjacent thyristors for controlling current flow therein;

a shallower trench portion in the substrate and including the control port; and a deeper trench portion extending deeper below the upper surface than the shallower trench portion and configured and arranged to electrically insulate the emitter regions of the at least two adjacent thyristors;

first and second pass devices, each pass device including first and second source/drain regions separated by a channel region and a gate capacitively coupled to the channel region;

a first emitter-access connector in the shallower trench portion and electrically coupling the emitter region in the first end portion of the thyristor to the first source/drain region of the first pass device;

a second emitter-access connector in the shallower trench portion and electrically coupling the emitter region in the first end portion of the second thyristor to the first source/drain region of the second pass device; and a shallow trench isolation (STI) region in the substrate, laterally between the first and second pass devices and configured and arranged for electrically insulating the source/drain regions of the first pass device from the source/drain regions of the second pass device.

5. The semiconductor device of claim 4, wherein the deeper trench portion is below the STI region.

6. A semiconductor device comprising:

a semiconductor substrate;

a thyristor having a body with an emitter region and an adjacent base region and having a control port, the emitter region being in the substrate and below the base region, the control port being adapted for capacitively coupling at least one edge of a volatage pulse to the base region;

a shallower trench portion in the substrate and including at least a portion of the control port; and a deeper trench portion having an upper region laterally adjacent to the shallower trench portion and having a lower region being arranged deeper into the substrate than the shallower trench portion and being arranged laterally to the emitter region;

wherein the deeper trench portion is lined with an insulative material configured and arranged for electrically insulating the emitter region, and the deeper trench portion further includes conductive material, the insulative material seperating the conductive material from the emitter region.

7. The semiconductor device of claim 6 further comprising a circuit structure in the semiconductor substrate and susceptible to reacting electrically in response to said at least one edge of a voltage pulse, wherein the deeper trench portion is configured and arranged to electrically insulate the emitter region from the circuit structure.

8. The semiconductor device of claim 6, wherein the deeper trench portion is configured and arranged to prevent lateral diffusion of dopants from the emitter region.

9. The semiconductor device of claim 6, wherein the shallower trench portion extends around at least a portion of the region.

10. The semiconductor device of claim 6, wherein the shallower trench portion and control port extend around at least a portion of the base region.

11. The semiconductor device of claim 6, further including a second thyristor having a body including a second emitter region in the substrate, laterally-adjacent to the deeper trench portion and electrically insulated from said emitter region by the deeper trench portion.

12. The semiconductor device of claim 6, wherein the conductive material includes at least a portion of the control port.

13. The semiconductor device of claim 6, further including:

a pass device having first and second source/drain regions separated by a channel region and a gate capacitively coupled to the channel region, the pass device being electrically coupled to the emitter region.

14. The semiconductor device of claim 13, further comprising a shallow trench isolation (STI) region in the substrate and adapted to electrically insulate the pass device from adjacent circuitry.

* * * * *